United States Patent
Kodama et al.

(10) Patent No.: US 11,461,008 B2
(45) Date of Patent: Oct. 4, 2022

(54) MEMORY SYSTEM FOR IMPROVING COMPRESSION PERFORMANCE OF A DICTIONARY CODER CIRCUIT

(71) Applicant: Kioxia Corporation, Minato-ku (JP)

(72) Inventors: Sho Kodama, Kawasaki (JP); Keiri Nakanishi, Kawasaki (JP); Kohei Oikawa, Kawasaki (JP); Daisuke Yashima, Tachikawa (JP); Masato Sumiyoshi, Yokohama (JP); Youhei Fukazawa, Kawasaki (JP)

(73) Assignee: Kioxia Corporation, Minato-ku (JP)

(*) Notice: Subject to any disclaimer, the term of this patent is extended or adjusted under 35 U.S.C. 154(b) by 0 days.

(21) Appl. No.: 16/998,031

(22) Filed: Aug. 20, 2020

(65) Prior Publication Data

US 2021/0294500 A1    Sep. 23, 2021

(30) Foreign Application Priority Data

Mar. 18, 2020    (JP) .............................. JP2020-047738

(51) Int. Cl.
*G06F 3/06*    (2006.01)
*H03M 7/30*    (2006.01)

(52) U.S. Cl.
CPC .......... *G06F 3/0608* (2013.01); *G06F 3/0656* (2013.01); *G06F 3/0659* (2013.01); *G06F 3/0679* (2013.01); *H03M 7/3086* (2013.01)

(58) Field of Classification Search
CPC .... G06F 3/0608; G06F 3/0656; G06F 3/0659; G06F 3/0679; G06F 3/0626; G06F 3/065
See application file for complete search history.

(56) References Cited

U.S. PATENT DOCUMENTS

| | | |
|---|---|---|
| 5,406,278 A | 4/1995 | Graybill et al. |
| 5,473,326 A | 12/1995 | Harrington et al. |
| 7,536,399 B2 | 5/2009 | Itani et al. |
| 8,134,483 B2 | 3/2012 | Shiraishi |
| 10,241,938 B1* | 3/2019 | Sim ...................... G06F 13/4239 |
| 2014/0266816 A1* | 9/2014 | Litvak ................. H03M 7/3084 341/51 |
| 2017/0192709 A1* | 7/2017 | Abali ................... H03M 7/6011 |
| 2017/0285960 A1* | 10/2017 | Yap ..................... H03M 7/3084 |
| 2019/0034333 A1* | 1/2019 | Sazegari ............. H03M 7/6023 |

FOREIGN PATENT DOCUMENTS

| | | |
|---|---|---|
| JP | 3889762 B2 | 3/2007 |
| JP | 5251799 B2 | 7/2013 |

* cited by examiner

*Primary Examiner* — Tracy A Warren
(74) *Attorney, Agent, or Firm* — Oblon, McClelland, Maier & Neustadt, L.L.P.

(57) ABSTRACT

A memory system including a history buffer, a hash calculator, a read pointer table, a history buffer writing circuit, a read pointer writing circuit, a read pointer reading circuit, a history buffer reading circuit, a matching circuit replacing the input data string with a reference information referring the matching candidate data string in the case where at least a part of the input data string and a part of the matching candidate data string match. Reading of the read pointer by the read pointer reading circuit and reading of the stored input data string by the history buffer reading circuit are executed after writing of the read pointer by the read pointer writing circuit and writing of the input data string by the history buffer writing circuit are finished.

9 Claims, 9 Drawing Sheets

MEMORY SYSTEM FOR IMPROVING COMPRESSION PERFORMANCE OF A DICTIONARY CODER CIRCUIT

CROSS REFERENCE TO RELATED APPLICATIONS

This application is based upon and claims the benefit of priority from the prior Japanese Patent Application No. 2020-047738 filed on Mar. 18, 2020, the entire contents of which are incorporated herein by reference.

FIELD

One embodiment of the present disclosure relates to a memory system comprising a non-volatile memory.

BACKGROUND

In recent years, memory systems equipped with non-volatile memories have become widely used. As such the memory systems, a solid state drive (SSD) having NAND flash memories is known.

When data are compressed in such the memory systems described above, a dictionary coder is used to replace an input data string which is a compression target, with a reference information for a stored input data string which has previously been input.

DETAILED DESCRIPTION

A memory system according to the embodiments of the present invention improves compression performance of a dictionary coder circuits.

A memory system in an embodiment according to the present disclosure includes a storage device and a memory controller controlling the storage device and compressing a input data string. The memory controller including: a history buffer storing a stored input data string; a hash calculator calculating a hash value based on the input data string; a read pointer table storing a read pointer indicating an address in the history buffer in an address designated by the hash value; a history buffer writing circuit writing the input data string to the history buffer; a read pointer writing circuit writing the read pointer of the input data string to an address designated by the hash value in the read pointer table; a read pointer reading circuit executing reading of the read pointer from the read pointer table using the hash value; a history buffer reading circuit reading the stored input data string as a matching candidate data string from the history buffer using the read pointer read by the read pointer reading circuit; and a matching circuit replacing the input data string with a reference information referring the matching candidate data string in the case where at least a part of the input data string and a part of the matching candidate data string match. Reading of the read pointer by the read pointer reading circuit and reading of the stored input data string by the history buffer reading circuit are executed after writing of the read pointer by the read pointer writing circuit and writing of the input data string by the history buffer writing circuit are finished.

Hereinafter, the memory system according to an embodiment is described in detail with reference to the drawings. In the following description, components having substantially the same functions and configurations are denoted by the same reference numerals, and duplicate descriptions are given only when necessary. Each of the embodiments described below exemplifies an apparatus and a method for embodying a technical idea of this embodiment. The technical idea of the embodiment is not specified as materials, shapes, structures, arrangements, and the like of the constituent parts described below. Various modifications may be made to the technical idea of the embodiment in addition to the scope of the claims.

In the following explanation, information of 1 Byte is referred to as "data", and information arranged in the order in which the data are inputted is referred to as "data string". However, "data" is not limited to the information of 1 Byte. "Compressing" means reducing the amount of information (e.g., the numbers of bit) of the target data string, and may be referred to as "encoding." "Decompressing" means restoring the compressed data string to its uncompressed condition, and may also be referred to as "decoding".

First Embodiment

The memory system according to a first embodiment is described. The memory system according to the first embodiment includes, for example, a NAND flash memory as a semiconductor memory device and a memory controller controlling the NAND flash memory.

[Overall Configuration of Memory System 1]

Figure 1:
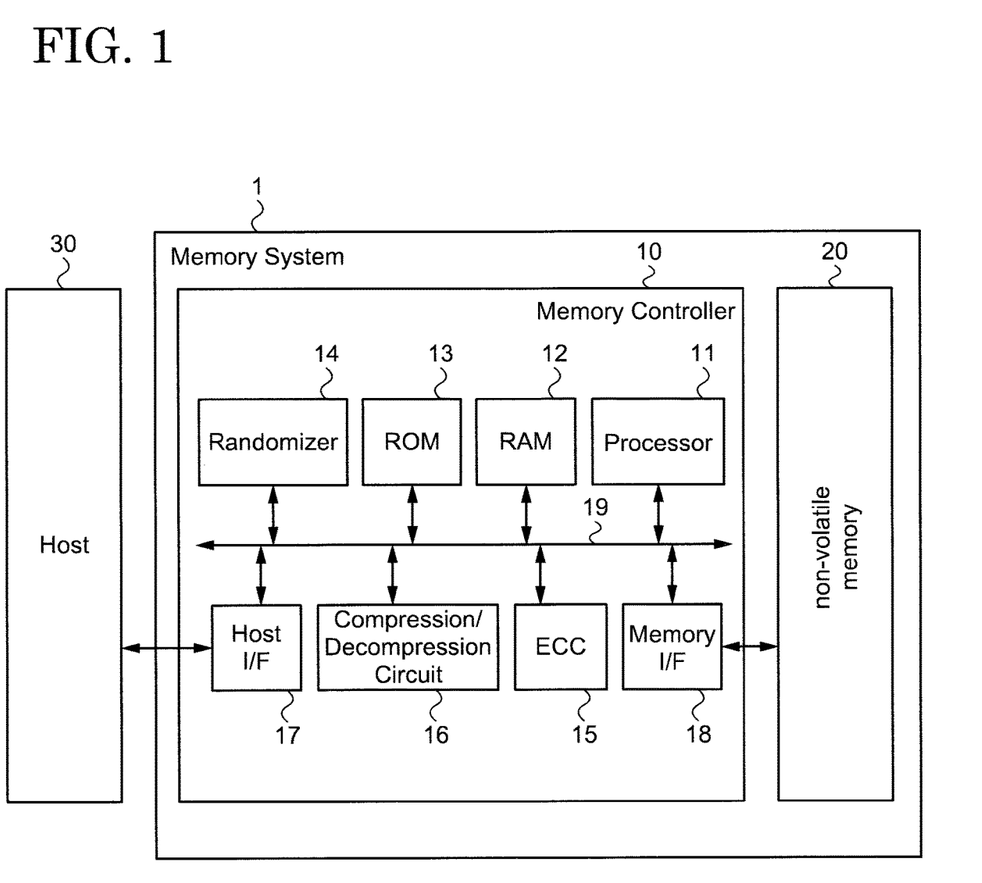
FIG. 1 is a block diagram illustrating a configuration of a memory system according to an embodiment.

FIG. 1 is a block diagram illustrating a configuration of a memory system according to an embodiment. As illustrated in FIG. 1, a memory system 1 includes a memory controller 10 and a non-volatile memory 20. The memory system 1 is connectable to a host 30. In FIG. 1, a state in which the memory system 1 and the host 30 are connected is shown. The host 30 is, for example, an electronic device such as a personal computer or a portable terminal.

The non-volatile memory 20 is a non-volatile memory that stores data in a nonvolatile manner, and is, for example, the NAND flash memory (hereinafter, simply referred to as a NAND memory). In the following explanation, the NAND memory is used as the non-volatile memory 20. However, the semiconductor memory device other than the NAND memory such as a three-dimensional flash memory, ReRAM (Resistance Random Access Memory), or FeRAM (Ferroelectric Random Access Memory) can be used as the non-volatile memory 20. It is not essential that the non-volatile memory 20 be the semiconductor memory device. The present embodiment can be applied to various storage media other than the semiconductor memory device.

The memory system 1 may be a memory card or the like in which the memory controller 10 and the non-volatile memory 20 are configured as a single package, or may be an SSD (Solid State Drive), or the like.

The memory controller 10 is, for example, a semiconductor integrated circuit configured as a SoC (System-On-a-Chip). Some or all of the operations of the respective components of the memory controller 10 described below are realized by hardware, but may be realized by executing firmware by a CPU (Central Processing Unit).

The memory controller 10 controls writing to the non-volatile memory 20 in accordance with a write request from the host 30 and controls reading from the non-volatile memory 20 in accordance with a read request from the host 30. The memory controller 10 includes a processor 11, a RAM (Random Access Memory) 12, a ROM (Read Only Memory) 13, a randomizer 14, an ECC circuit 15, a compression/decompression circuit 16, a host I/F (host interface) 17, and a memory I/F (memory interface) 18. These functional blocks are interconnected by an internal bus 19.

The compression/decompression circuit 16 operates as an encoder compressing data to be written to the non-volatile memory 20. The compression/decompression circuit 16 also operates as a decoder decompressing data read from the non-volatile memory 20. Detailed configuration and operation of the compression/decompression circuit 16 are described later.

The host I/F 17 performs operations according to the interface standard between the host 30 and the host I/F 17. The host I/F 17 outputs the request received from the host 30 and data to be written to the internal bus 19. The host I/F 17 transmits data read from the non-volatile memory 20 and decompressed by the compression/decompression circuit 16 to the host 30, and transmits responses from the processor 11 to the host 30.

The memory I/F 18 performs a write operation to the non-volatile memory 20 according to the instructions from the processor 11. The memory I/F 18 performs a read operation from the non-volatile memory 20 according to the instructions from the processor 11.

The processor 11 is a control section that comprehensively controls each functional block of the memory system 1. When the processor 11 receives a request from the host 30 through the host I/F 17, the processor 11 performs control in response to the request. For example, the processor 11 instructs the memory I/F 18 to write data to the non-volatile memory 20 in response to the write request from the host 30. The processor 11 instructs the memory I/F 18 to read data from the non-volatile memory 20 in response to the read request from the host 30.

When the processor 11 receives the write request from the host 30, the processor 11 determines the storage area (memory area) on the non-volatile memory 20 for the data to be stored in the RAM12. That is, the processor 11 manages address to which data is written. A correspondence relationship between a logical address of the data received from the host 30 and a physical address indicating the storage area on the non-volatile memory 20 in which the data are stored is stored as an address conversion table.

When the processor 11 receives the read request from the host 30, the processor 11 converts the logical address specified by the read request to the physical address using the address conversion table described above, and instructs the memory I/F 18 to read from the physical address.

In the NAND memory, generally, data are written and read in units of data called pages, and erased in units of data called blocks. A plurality of memory cells connected to the same word line are called memory cell group. In the case where the memory cell is an SLC (Single Level Cell), one memory cell group corresponds to one page. In the case where the memory cell is a multi-bit cell such as an MLC, a TLC or a QLC, one memory cell group corresponds to a plurality of pages. Each memory cell is connected to both the word line and a bit line. Thus, each memory cell can identify using an address identifying the word line and an address identifying the bit line.

The RAM 12 is used, for example, as a data buffer and temporarily stores data received from the host 30 until the memory controller 10 stores the data to the non-volatile memory 20. The RAM 12 temporarily stores the data read from the non-volatile memory 20 until it is transmitted to the host 30. For example, the RAM 12 can be used as a general purpose memory, such as an SRAM (Static Random Access Memory) or a DRAM (Dynamic Random Access Memory).

The RAM 12 may be used as a working memory storing various management tables such as an address conversion table, a master table (snapshot) that is read from a particular area of the non-volatile memory 20 and developed at a time of activation or the like, or log information which is a change difference in various management tables.

The ROM 13 records various programs, parameters, and the like to operate the memory controller 10. The programs, parameters, and the like stored in the ROM 13 are read and executed by the processor 11 as required.

The randomizer 14 includes, for example, a linear feedback shift register and the like, and generates a pseudo-random number uniquely obtained with respect to the inputted seed values. For example, the pseudo-random number generated by the randomizer 14 is calculated an exclusive OR with the write data in the processor 11. Accordingly, the write data to be written to the non-volatile memory 20 is randomized.

The data transmitted from the host 30 is transferred to the internal bus 19 and temporarily stored in the RAM 12. The data are compressed by the compression/decompression circuit 16 and performed an error correction encoding by the ECC circuit 15. Then, the data are written to the non-volatile memory 20 via the memory I/F 18. On the other hand, data read from the non-volatile memory 20 is performed an error correction decoding by the ECC circuit 15. Thereafter, the data are decompressed by the compression/decompression circuit 16 to restore the original data. The restored data are, for example temporarily stored in the RAM12 and then transferred to the host 30 via host I/F 17. The data encoded by the compression/decompression circuit 16 and/or the ECC circuit 15 may include a control data or the like used in the memory controller 10, in addition to the other data described above.

In the write process according to the memory system 1 having the above-described configuration, the processor 11 instructs the compression/decompression circuit 16 to compress the data when the data are written to the non-volatile memory 20. At this time, the processor 11 determines the storage location (storage address) of the write data in the non-volatile memory 20, and instructs the memory I/F 18 the determined storage location. The compression/decompression circuit 16 compresses the data on the RAM 12 based on the instruction from the processor 11. Further, the ECC circuit 15 ECC decodes the compressed data on the RAM 12 based on the instruction from the processor 11. The generated write data are written via the memory I/F 18 to a specified storage location in the non-volatile memory 20. As an encoding method of the ECC circuit 15, for example, an encoding method using an LDPC (Low-Density Parity-Check) code, a BCH (Bose-Chaudhuri-Hocquenghem) code, or an RS (Reed-Solomon) code can be adopted.

On the other hand, in the read process, when the processor 11 reads from the non-volatile memory 20, the processor 11 specifies an address on the non-volatile memory 20 and instructs the memory I/F 18 to read. The processor 11 instructs the ECC circuit 15 to start the ECC decoding, and also instructs the compression/decompression circuit 16 to start decompressing. The memory I/F 18 executes a read to the specified address of the non-volatile memory 20 in accordance with the instruction from the processor 11, and inputs the read data obtained by the read process to the ECC circuit 15. The ECC circuit 15 ECC decodes the input read data. The compression/decompression circuit 16 decompress the ECC decoded data. When this decompression is successful, the processor 11 stores the decompressed original data in the RAM 12. On the other hand, when the ECC-decoding and decompression fail, the processor 11, for example notifies the host 30 of a read error.

[Whole Configuration of Compression Circuit 50]

In the compression/decompression circuit 16, a compression technique using a dictionary coder using a similarity of data string, such as the LZ77 compression, is used. A compression function provided in the compression/decompression circuit 16 compresses the data string which is the compression target by replacing the data string which is the compression target with information referring (or matching) a data string previously input. A decompression function provided in the compression/decompression circuit 16 decompresses the compressed data string based on stored decompressed data string previously decompressed and symbols. The symbol is the information, including "location information" indicating an address in the history buffer in which the data string that has been decompressed in the past is stored, and "length information" indicating the number of data from the start position of the data string stored in the address. In the following description, a compression circuit 50 having a compressing function of the compression/decompression circuit 16 is described. Since a common circuit can be used as the decompression circuit having the decompressing function of the compression/decompression circuit 16, the description thereof is omitted.

Figure 2:
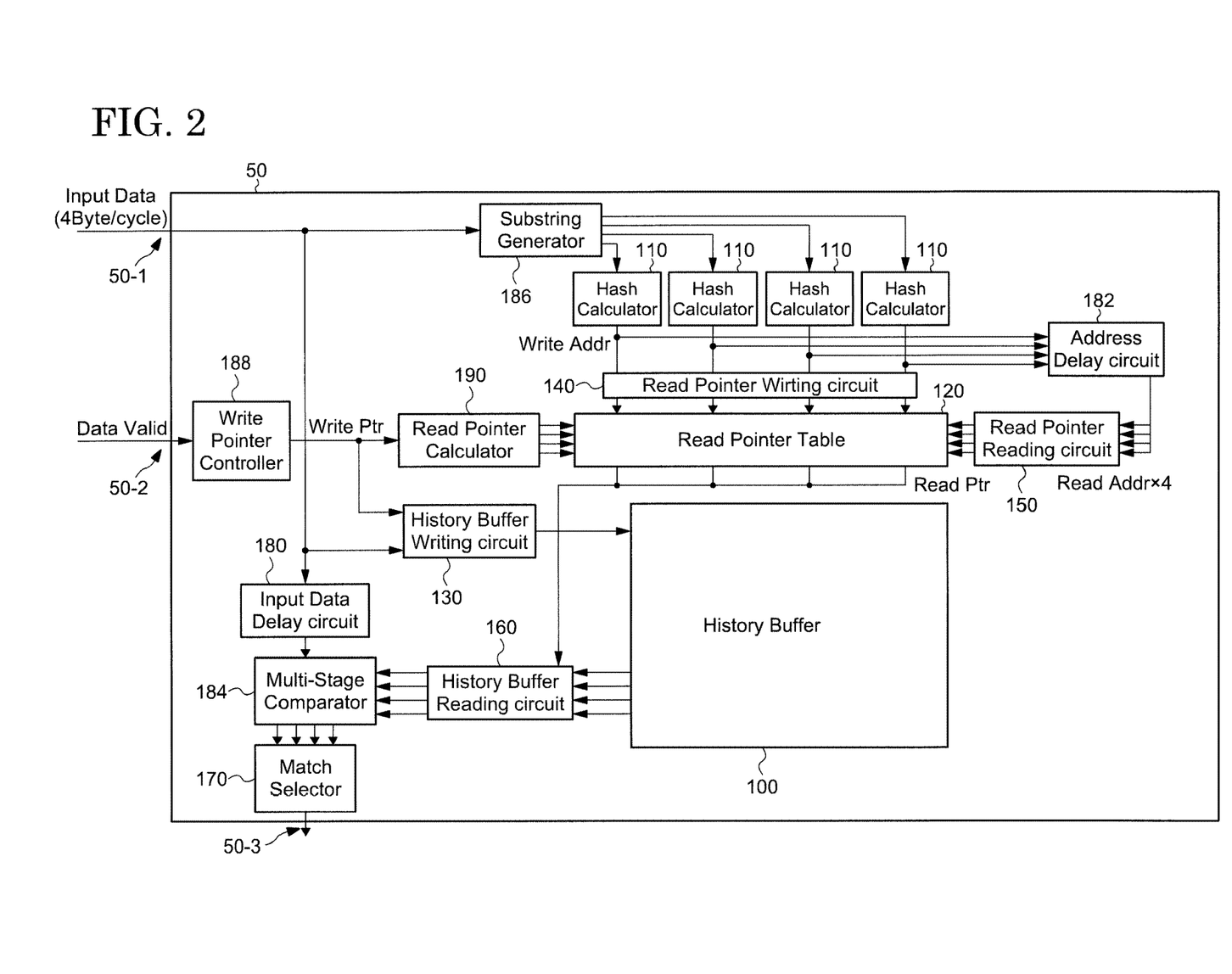
FIG. 2 is a block diagram illustrating a configuration of a compression circuit according to an embodiment.

FIG. 2 is a block diagram illustrating the configuration of a compression circuit according to an embodiment. As shown in FIG. 2, a compression circuit 50 includes a history buffer 100, a hash calculator 110, a read pointer table 120, a history buffer writing circuit 130, a read pointer writing circuit 140, a read pointer reading circuit 150, a history buffer reading circuit 160, a matching selector 170, an input data delay circuit 180, an address delay circuit 182, a multi-stage comparator 184, a substring generator 186, a write pointer controller 188 and a read pointer calculator 190. The compression circuit 50 includes a first input terminal 50-1 and a second input terminal 50-2. An input data string (Input Data) which is compression target is input to the first input terminal 50-1. A control information (Data Valid) indicating whether the input data string input to the first input terminal 50-1 is valid or invalid for writing to the history buffer 100 is input to the second input terminal 50-2.

Figure 3:
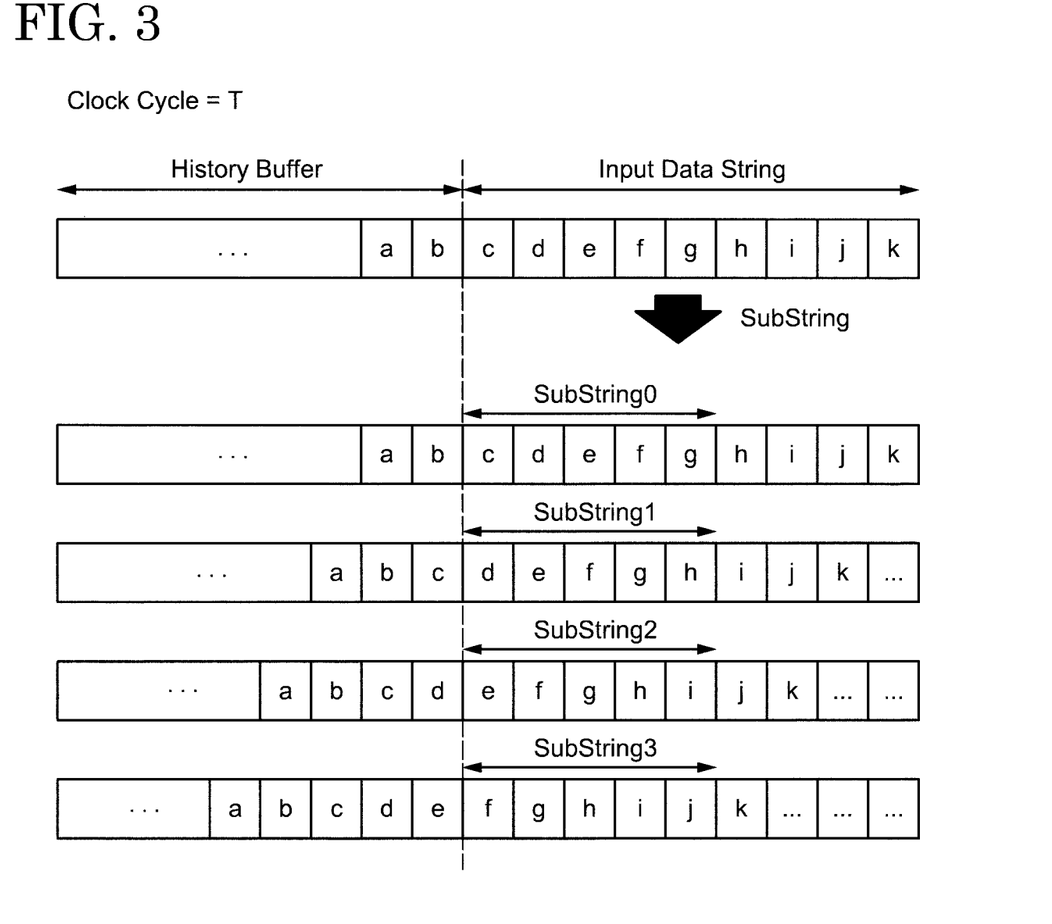
FIG. 3 is a conceptual diagram illustrating a compressing operation of a compression circuit according to an embodiment.

The compression circuit 50 according to the present embodiment, generates a plurality of substrings (SubString 0 to 3) in which the data string is sequentially shifted by one byte as shown in FIG. 3 based on the input data string which is compression target, and compresses in parallel on each of the substrings. Therefore, the compression circuit 50 shown in FIG. 2 processes four bytes in one cycle.

The history buffer 100 stores a stored input data string in which the data input to the compression circuit 50 in the past are arranged in the input order. In other words, the history buffer 100 stores data strings input to the compression circuit 50 prior to the start position of the input data string of compression target. The history buffer 100 stores, for example, several kilobytes to several tens kilobytes of input data. The history buffer 100 is a buffer having a flip-flop configuration based on a ring buffer policy. The history buffer 100 has a configuration in which address can be specified in bytes, and can process a plurality of read requests and write requests. The history buffer 100 may include a SRAM.

An input terminal of the history buffer writing circuit 130 is connected to the first input terminal 50-1. An output terminal of the history buffer writing circuit 130 is connected to the input terminal of the history buffer 100. The history buffer writing circuit 130 writes the input data string input to the compression circuit 50 to the history buffer 100.

An input terminal of the write pointer controller 188 is connected to the second input terminal 50-2. An output terminal of the write pointer controller 188 is connected to the history buffer writing circuit 130 and the read pointer calculator 190. The write pointer controller 188 manages the address (write pointer: Write Ptr) at which the history buffer writing circuit 130 writes the input data string to the history buffer 100. That is, the write pointer controller 188 updates the write pointer when the input data string is written to the history buffer 100 by the history buffer writing circuit 130, and manages an address in which a next input data string is written. The write pointer managing circuit 188 instructs the history buffer writing circuit 130 to the write pointer when the control information input to the second input terminal 50-2 is "valid", and prohibits writing to the history buffer writing circuit 130 when the control information is "invalid".

Each time the input data string which is the compression target based on the write pointer managed by the write pointer controller 188 is input, the write pointer controller 188 increments the write pointer by four. The number of increments can be adjusted to match the number of the substrings. That is, in the case where the number of the substring is k, the write pointer controller 188 increments the write pointer by k each time the input data string is input. The write pointer controller 188 performs wrap around the write pointer to the start position when the write pointer reaches the end of the history buffer 100.

An input terminal of the substring generator 186 is connected to the first input terminal 50-1. An output terminal of substring generator 186 is connected to the input terminals of the plurality of hash calculators 110. The substring generator 186 generates a plurality of substrings based on the input data string input to the compression circuit 50, and outputs the substrings to the hash calculator 110. In this embodiment, as shown in FIG. 3, the substring generator 186 generates four substrings, but the number of generated substrings may be three or less, or five or more.

An output terminal of the hash calculator 110 is connected to an input terminal of the read pointer writing circuit 140 and an input terminal of the address delay circuit 182. In this embodiment, a hash calculator 110 is provided for each of the plurality of substrings. In the illustration of FIG. 2, the four hash calculators 110 are arranged because the four substrings are generated based on the input data string. The hash calculator 110 calculates a hash value from the input data string which is the compression target. Specifically, the hash calculator 110 obtains a hash value for the data corresponding to the minimum matching length from the start position of the data of the respective substrings (input data string) input to the hash calculator 110.

Here, the minimum matching length is the number of bytes used as an indicator to determine whether the compression process is performed or not. The compression circuit 50 compares the input data string and the stored input data string which are stored in the history buffer 100 in the past, and executes the compression process according to the present embodiment when the data string that matches N-byte or more from the start position of the data of the input data string is stored in the history buffer 100. The N-byte mentioned above is the minimum matching length. That is, when the hash values of the two data strings are the same value, data at least from the starting position to the minimum matching length indicate the same value in the two data strings. In other words, the compression circuit 50 determines the necessity of the compressing process based on the hash values of the two data strings.

An output terminal of the read pointer writing circuit 140 is connected to the read pointer table 120. The read pointer writing circuit 140 writes information regarding to the address stored at the input data string in the history buffer 100 to the address specified by the hash value in the read pointer table 120. The hash value is calculated from the input data string.

The read pointer table 120 is a data table in which the address in the history buffer 100 of the stored input data string is stored in association with the hash value obtained by the hash calculator 110 based on the stored input data string. When the read pointer table 120 is searched using a hash value as a key value, the address in the history buffer 100 associated with the hash value is output as a search result. Thus, the address obtained by the search result is called "read pointer". In other words, the read pointer table 120 stores the read pointer to specified address by the hash value which the read pointer indicating the address in the history buffer 100. The read pointer table 120 is a data table in a flip-flop configuration and can process a plurality of read and write requests. The read pointer table 120 may include a SRAM.

When the read pointer writing circuit 140 writes the read pointer to an address based on the hash value in the read pointer table 120, the old read pointer stored in the read pointer table 120 is updated to the new read pointer. The updated read pointer is associated with the write pointer by the read pointer calculator 190. An output terminal of the read pointer calculator 190 are connected to the read pointer table 120.

The read pointer calculator 190 calculates read pointers of the respective substrings generated by the substring generator 186. The read pointers of the respective substrings indicate the addresses in the history buffer 100. That is, the read pointer is calculated based on the write pointer. Specifically, the read pointer of the substring among the four substrings in FIG. 2 that matches the input data string input in the first input terminal 50-1 has the same value as the write pointer. The read pointer of the substring shifted by 1 byte from the above substring has a value of the write pointer+1, and the read pointer of the substring shifted by N-bytes has a value of the write pointer+N.

An output terminal of the address delay circuit 182 is connected to the read pointer reading circuit 150. The address delay circuit 182 receives the hash value from the hash calculator 110, delays (holds) the hash value, and then transmits the hash value to the read pointer reading circuit 150. In this embodiment, the address delay circuit 182 receives the hash value from each of the four hash calculators 110 and delays each hash value. A delay period by the address delay circuit 182 can be appropriately adjusted according to the circuit design, but can be delayed for example 1 to 2 cycles.

An output terminal of the read pointer reading circuit 150 is connected to the read pointer table 120. The read pointer reading circuit 150 inputs the address determined by the hash value received via the address delay circuit 182 to the read pointer table 120. The address input to the read pointer table 120 is the address in the read pointer table 120. A read pointer is read from the read pointer table 120 when the corresponding address is input. In the present embodiment, the read pointer reading circuit 150 inputs the address (address in the read pointer table 120) determined by each of the four hash value received from the address delay circuit 182 to the read pointer table 120. The read pointer corresponding to each hash value is read when the corresponding address is input. In other words, the function of the read pointer reading circuit 150 described above, the read pointer reading circuit 150 executes the reading of read pointer from the read pointer table 120 using the hash value described above. Here, the read pointer reading circuit 150 inputs the address into the read pointer table 120 using the hash value delayed by the address delay circuit 182, therefore when the read pointer corresponding to the hash value is read, writing to the address specified by the same hash value as the hash value described in above is completed.

An input terminal of the history buffer reading circuit 160 is connected to the history buffer 100 and the read pointer table 120. An output terminal of the history buffer reading circuit 160 is connected to the multi-stage comparator 184. The history buffer reading circuit 160 reads the stored input data string from the history buffer 100 using the read pointer read by the address input of the read pointer reading circuit 150. The stored input data string read by the history buffer reading circuit 160 determines whether input data string which is the target compression can be replaced by information referring a previously input data string. That is, the stored input data string is a data string used to determine whether the input data string matches the previously input data string. The stored input data string may be called the matching candidate data string. In this embodiment, the four matching candidate data strings are read using the four read pointers.

As described above, the hash value output from the hash calculator 110 is transmitted to the read pointer reading circuit 150 via address delay circuit 182, whereby the reading of the read pointer by the read pointer reading circuit 150 and the reading of the stored input data string by the history buffer reading circuit 160 are executed after the writing of the read pointer by the read pointer writing circuit 140 and the writing of the input data string by the history buffer writing circuit 130 are completed.

An input terminal of the input data delay circuit 180 is connected to the first input terminal 50-1. An output terminal of the input data delay circuit 180 is connected to the multi-stage comparator 184. The input data delay circuit 180 delays the input data string input to the compression circuit 50 and sends it to the multi-stage comparator 184. A delay period of the input data delay circuit 180 may be the same as the delay period of the address delay circuit 182 or may be determined based on the delay period of the address delay circuit 182. The delay period of the input data delay circuit 180 is determined in accordance with a timing at which the history buffer reading circuit 160 reads the matching candidate data string after the delay due to the address delay circuit 182.

An output terminal of the multi-stage comparator 184 is connected to the matching selector 170. The multi-stage comparator 184 compares the matching candidate data string read by the history buffer reading circuit 160 from the history buffer 100 with the input data string delayed by the input data delay circuit 180 to determine the matching length. In this embodiment, the multi-stage comparator 184 compares each of the four matching candidate data string with the input data string and determine each matching length.

An output terminal of the matching selector 170 is connected to an output terminal 50-3 of the compression circuit 50. The matching selector 170 combines the individual matching result determined by the multi-stage comparator 184 to generate the final matching result. In this embodiment, as matching result, the result of replacing the input data string with the reference information referring to the matching candidate data string matching the input data string is output. For example, the reference information is the address and the matching length. For example, the address of the reference information is the address of the start position data of the matching candidate data string that matches the input data string (for example, the distance from the start position data of the input data string) in the history buffer 100. The matching length of the reference information is the matching length from the start position. Finally, the matching selector 170 combines the four matching result determined by the multi-stage comparator 184.

The matching selector 170 starts processing from a following data position next to the last data among the data included in the matching result obtained by the process one-cycle earlier. Here, the "last data" corresponds to the most recent data "b" stored in the history buffer 100 in FIG. 3, and the "following data" corresponds to the start position data "c" of a following input data string to the data "b." The matching selector 170 verifies the matching result for every substring having a data string that start position is the data "c".

In the case where a data match of the minimum matching length is not confirmed in comparing the input data string with the stored input data string, the matching selector 170 processes a substring having an index value larger than the present substring by one as a next start position of data in principle. However, even if the data match is not confirmed in the present substring, but the data match is confirmed in a preceding substring, the process is performed to a substring which has an index value larger than the present substring in number based on the matching length found in the preceding substring as the data of the following start position. For example, in FIG. 3, when the data match (the matching length 3) is confirmed in the substring 1, even if the data match is not confirmed in the substring 2, since the data match is confirmed up to the data "f", the process is performed on the substring in which the start position data is "g". That is, the following process is performed to a substring which has an index value larger than an index value of the substring 1 of the matching length (e.g. "3").

When the multi-stage comparator 184 and the matching selector 170 mentioned above are collectively referred to as the matching circuit, they can be expressed as follows. The matching circuit compares the input data string with the matching candidate data string and, in the case where at least these data are partially matched, replaces input data string with the reference information referencing the matching candidate data string. The operation of the matching circuit may be referred to as a data-matching determination process.

[Operation Flowchart of Compressive Operation of Compression Circuit 50]

Figure 4:
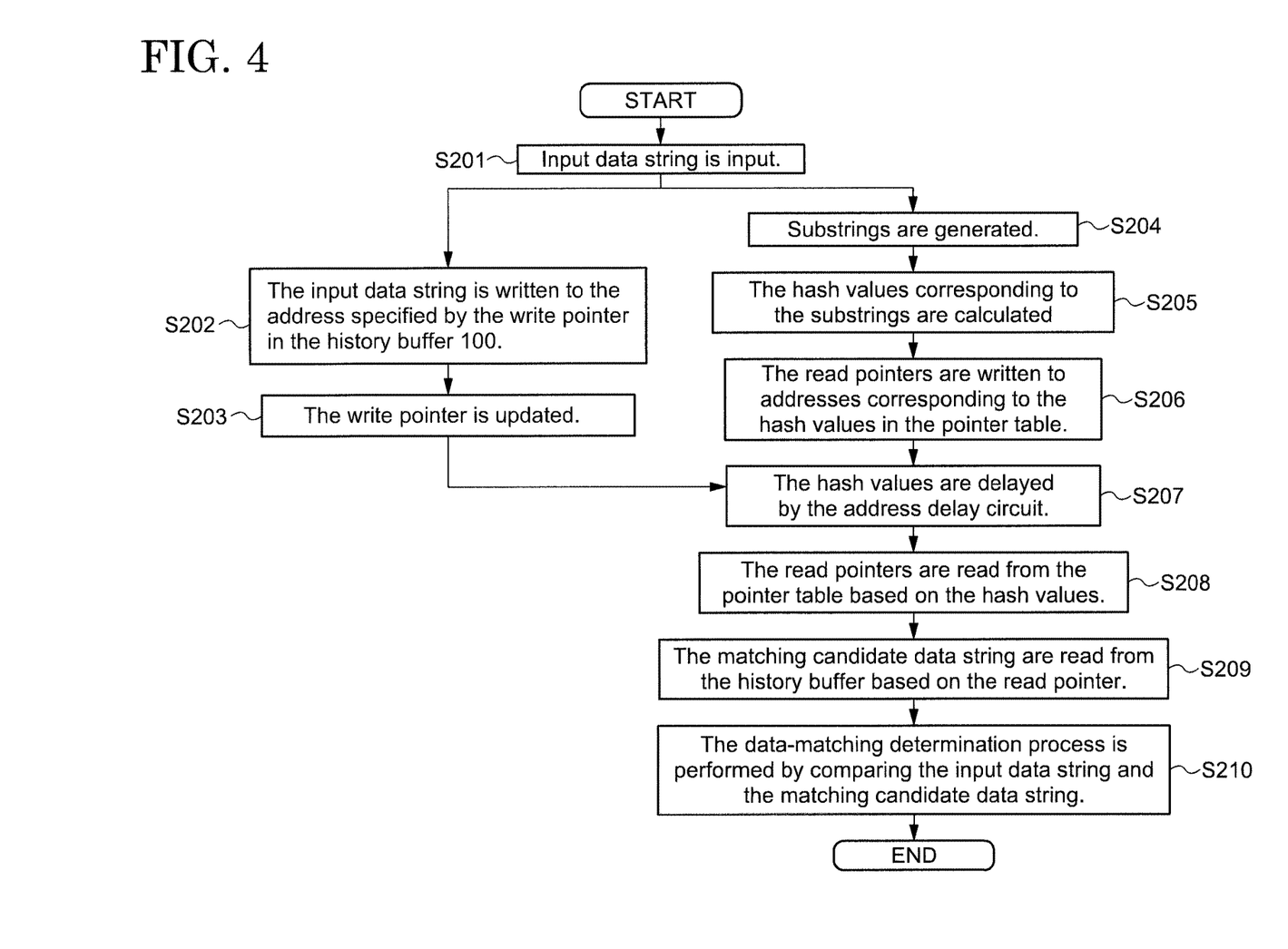
FIG. 4 is a flow chart illustrating a compressing operation of a compression circuit according to an embodiment.

FIG. 4 is a flowchart illustrating a compressing operation of a compression circuit according to an embodiment. The operation flow of FIG. 4 is described with reference to FIG. 2. As shown in FIG. 4, when the operation of the compression circuit 50 starts, the input data string is input to the first input terminal 50-1 as a compression target string (step S201). The input data string is written to the address specified by the write pointer in the history buffer 100 by the history buffer writing circuit 130 (step S202). When the input data string is written to the history buffer 100, the write pointer is updated by the write pointer controller 188 (step S203).

In parallel with the above step S202 and S203, the following step S204 to S206 are performed. Based on the input data string input to the first input terminal 50-1, substrings are generated by the substring generator 186 (step S204). In this embodiment, four substrings are generated. The generated substrings are input to the hash calculators 110, and the hash values corresponding to the substrings are calculated (step S205). The read pointers corresponding to the hash values are written to addresses corresponding to the calculated hash values in the read pointer table 120 by the read pointer writing circuit 140 (step S206).

After step S206, the hash values are delayed by the address delay circuit 182 and transmitted to the read pointer reading circuit 150 (step S207). Reading of the read pointers by the read pointer reading circuit 150 is performed after the reading is delayed by the address delay circuit 182 until updating of the write pointers in the step S203 has been completed. The delay period of the address delay circuit 182 may be a fixed period and may be determined based on a signal indicating that transmitting from the write pointer controller 188 to the address delay circuit 182 and updating of the write pointer has been completed.

As described above, when the read pointer reading circuit 150 receives the hash values, the addresses determined by the hash values in the read pointer table 120 are input to the read pointer table 120. The read pointers are read from the read pointer table 120 by inputting the addresses (Step S208). At this point, the history buffer 100 stores the input data string corresponding to the hash values used to read the read pointers. In addition, the information related to the addresses in history buffer 100 storing the input data string are stored in read pointer table 120. Therefore, when reading the stored input data string (matching candidate data string) from the history buffer 100 based on the read pointer (step S209), a part of the input data string of the same cycle can be used. Then, the matching candidate data string read from the history buffer 100 and the input data string are compared, and the data-matching determination process is performed (step S210).

[Examples of Compressive Operation of Compression Circuit 50]

Figure 5:
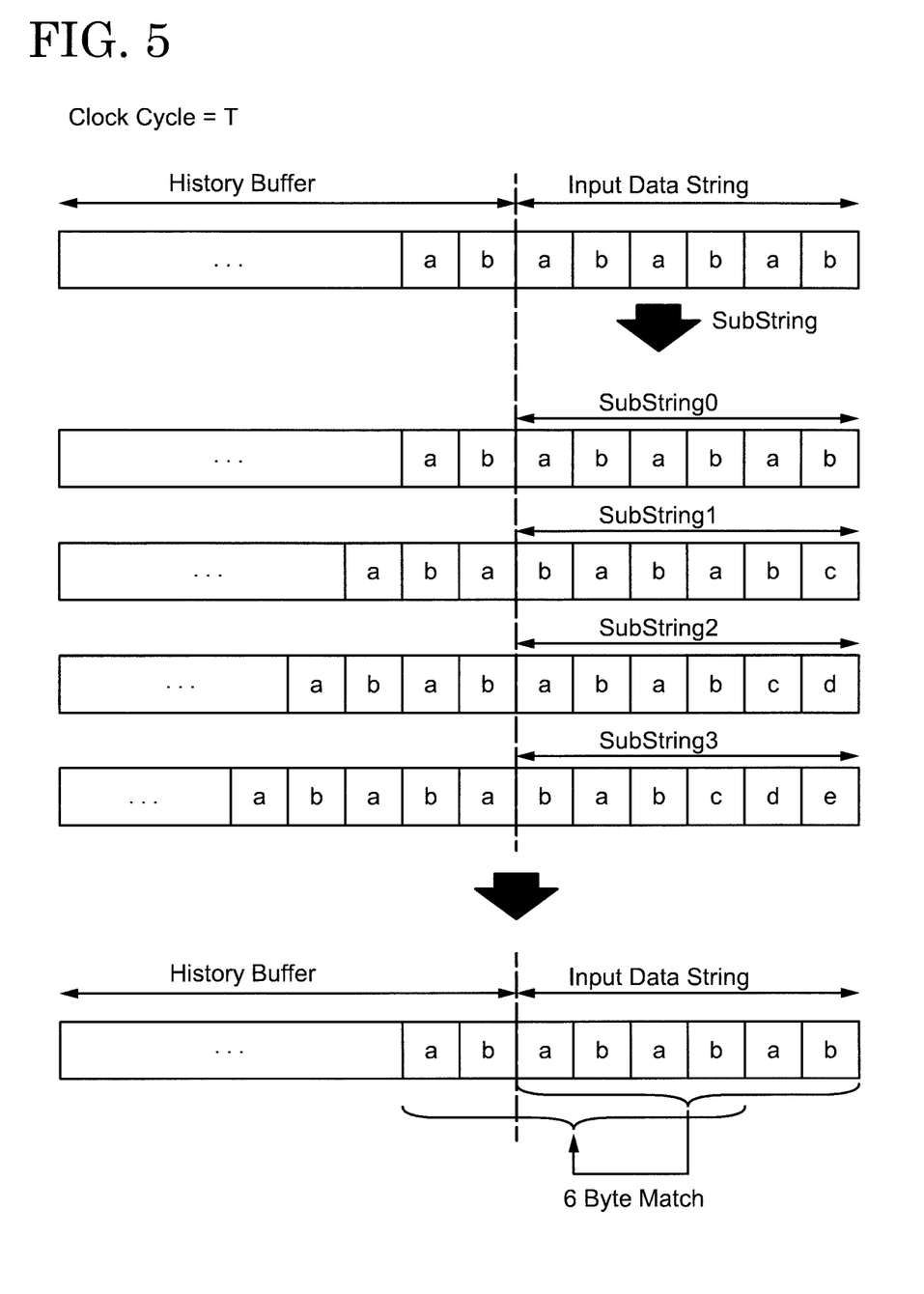
FIG. 5 is a conceptual diagram illustrating a compressing operation of a compression circuit according to an embodiment.

With reference to FIG. 5, the compressing operation of the compression circuit 50 is described with reference to a specific data string. FIG. 5 is a conceptual diagram for explaining the compressing operation of the compression circuit according to an embodiment. In FIG. 5, an example that the stored input data string " . . . ab" is stored in the history buffer 100, and the data string "ababab" is input as the input data string is illustrated.

The substrings 0 to 3 are generated based on the input data string. As shown in FIG. 5, the substring 0 is the data string "ababab", the substring 1 is the data string "bababc", the substring 2 is the data string "ababcd", and the substring 3 is the data string "babcde". In this case, the minimum matching length is 3.

Regarding the substring 0, the data "aba" corresponding to 3 bytes from the start position of the input data string do not exist in the stored input data string in the history buffer 100. Therefore, the matching result that the data match is not confirmed is obtained. Regarding the substring 1, the data "bab" corresponding to 3 bytes from the start position of the input data string also do not exist in the stored input data string in the history buffer 100. Therefore, the matching result that the data match is not confirmed is obtained as the matching result.

Regarding the substring 2, the data "abab" corresponding to 4 bytes from the start position of the input data string exists in the stored input data string in the history buffer 100. In other words, the matching result that the data match is confirmed is obtained. The distance from the start position (the first "a" of " . . . abab" stored in the history buffer 100) of the stored input data string that the data match is confirmed to the start position of the input data string (start position [a] in substring 2) is 4 bytes, and the matching length is 4 bytes. The reference information can be expressed as (distance:matching length)=(4:4). Regarding the substring 3, the data "bab" corresponding to 3 bytes from the start position of the input data string exists in the stored input data string in the history buffer 100. In other words, the matching result that the data match is confirmed is obtained. The distance from the start position of the stored input data string that the data match is confirmed to the start position of the input data string is 4 bytes, and the matching length is 3 bytes. The reference information can be expressed as (distance:matching length)=(4:3).

The matching result of substrings 0 to 3 described above are combined by the matching selector 170 to generate the final matching result. The final matching result allows "ababab" of the input data string to be compressed using the reference information that refers to the data string including the last 2 bytes of the data "ab" stored in the history buffer 100 and the 4 bytes of data "abab" in the start position of the input data string. In this case, the reference information can be expressed as (distance:matching length)=(2:6).

Figure 6:
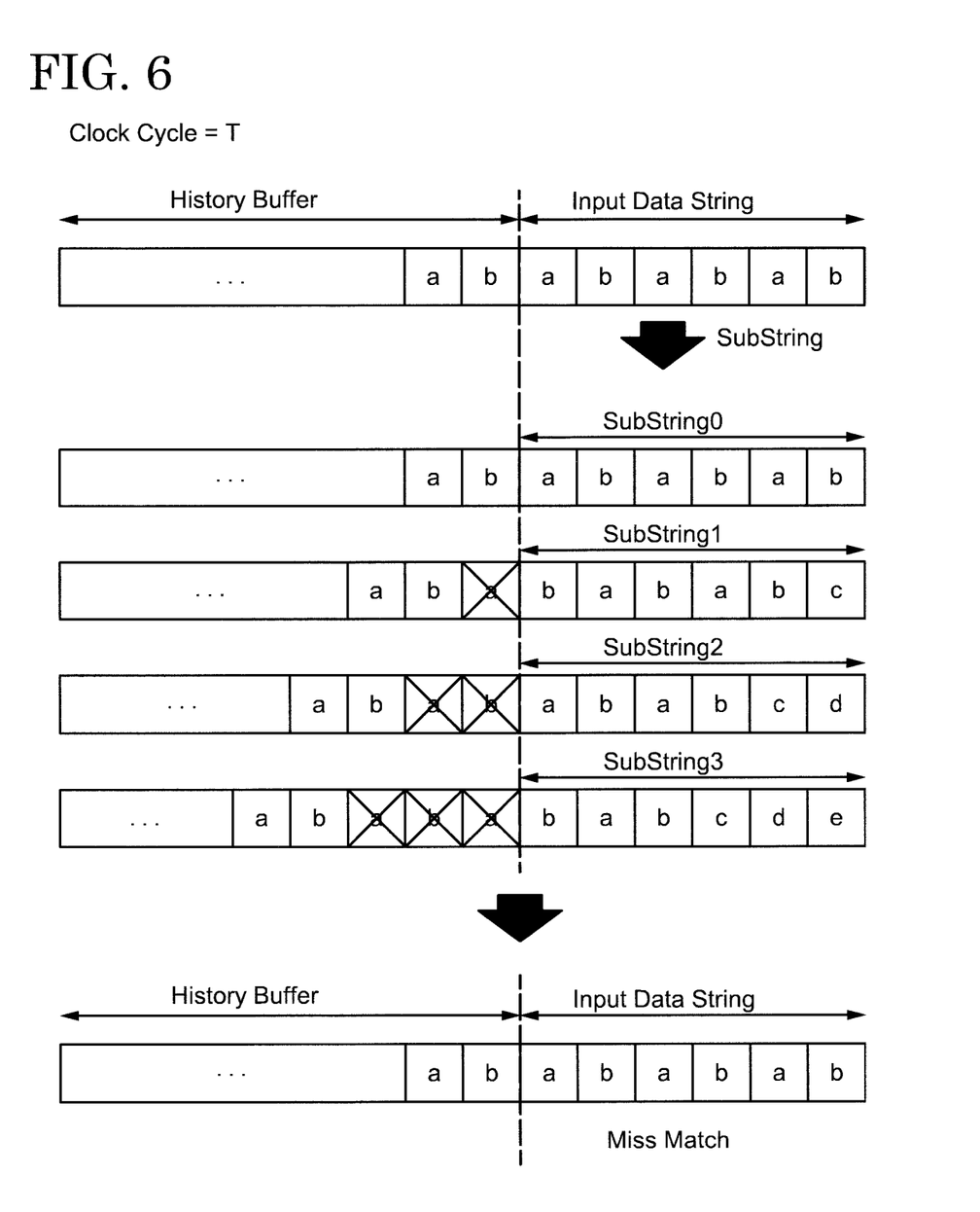
FIG. 6 is a conceptual diagram illustrating a compressing operation of a compression circuit in the memory system of the comparative embodiment.

On the other hand, the compressing operation of the compression circuit in the memory system according to the comparative embodiment is described with the reference to FIG. 6. FIG. 6 is a conceptual diagram for explaining the compression circuit compressing operation in the memory system of the comparative embodiment. Although the operation of FIG. 6 is similar to the operation of FIG. 5, in the memory system of the comparative example, the updating of the write pointer in the step S203 shown in FIG. 4, the reading of the read pointer using the hash value in the step S208, and the writing of the read pointer corresponding to the hash value in the step S206 are performed at the same timing, so that it is impossible to refer to a part of the input data string input in the same cycle. That is, not only when processing for the substring 0 but also when processing for substrings 1 to 3, only " . . . ab" is stored in the history buffer. Therefore, in the memory system of the comparative example, the matching result that the data match is not confirmed (Miss Match) is obtained for the substrings 0 to 3.

As described above, according to the memory system 1 of the first embodiment, a part of input data string of compression target can be referred, so that the compressing performance can be improved.

Second Embodiment

Figure 7:
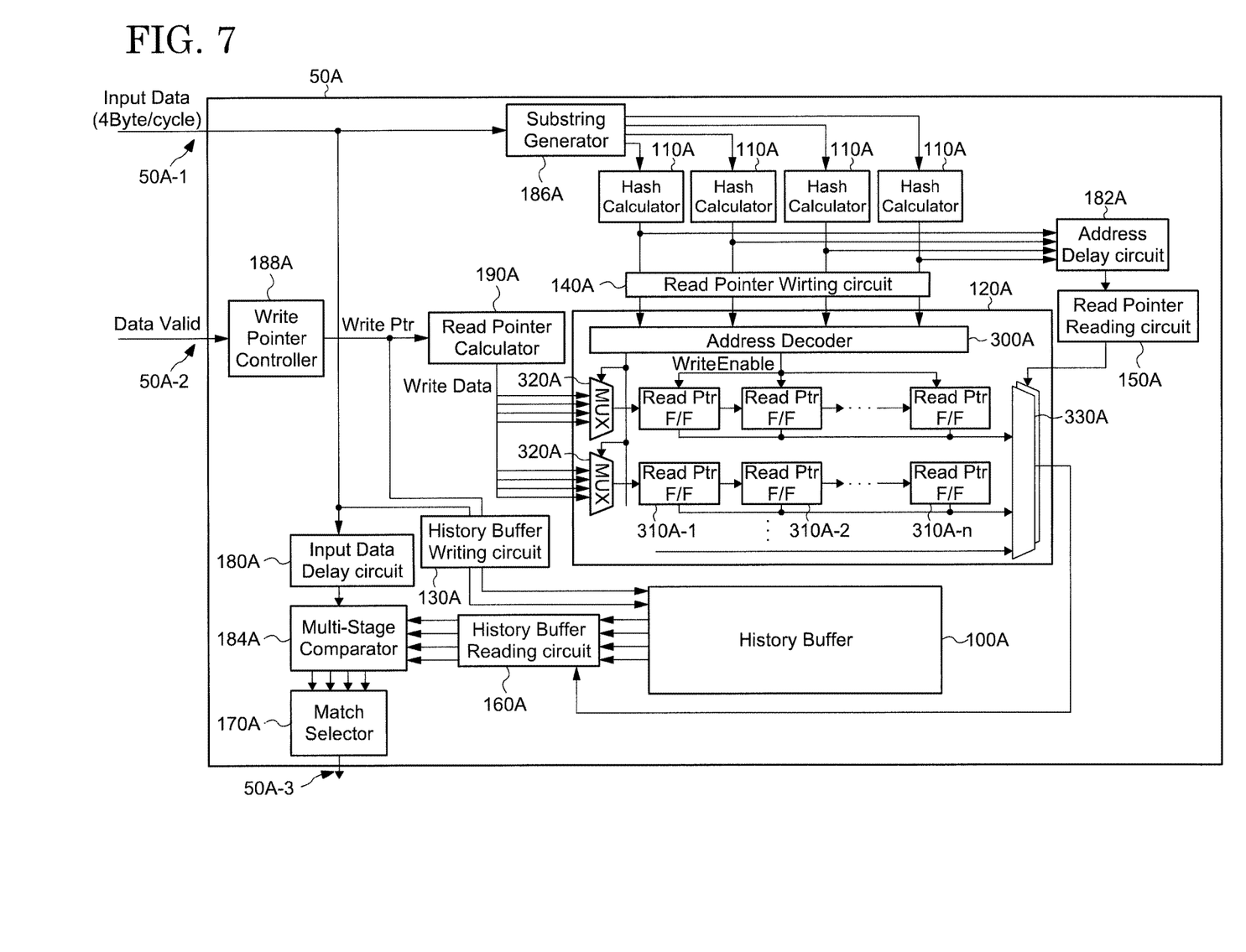
FIG. 7 is a block diagram illustrating a configuration of a compression circuit according to an embodiment.

In the second embodiment, a compression circuit 50A having a configuration similar to that of the compression circuit 50 in the first embodiment is described. FIG. 7 is a block diagram illustrating a configuration of a compression circuit according to an embodiment. The compression circuit 50A shown in FIG. 7 is similar to the compression circuit 50 shown in FIG. 2, but a configuration of a read pointer table 120A differs from the configuration of the read pointer table 120. In the following description, descriptions of the same features as those of the configuration of FIG. 2 are omitted, and points mainly different from those of the configuration of FIG. 2 are described.

As shown in FIG. 7, the read pointer table 120A includes an address decoder 300A, a plurality of flip-flop circuits 310A, an input multiplexer 320A, and an output multiplexer 330A. The plurality of flip-flop circuits 310A connected in series to one of the input multiplexers 320A is a flip-flop circuit arranged for the same address (or the same hash value). Each flip-flop circuit 310A stores a read pointer. A First-In First-Out (FIFO) is used for a plurality of flip-flop circuit 310A arranged for the same address. The number of combinations of the plurality of flip-flop circuits 310A and the input multiplexer 320A is at least more than the number of addresses. The plurality of flip-flop circuits 310A are arranged for the same address. When each circuit is described separately, it is referred to as the flip-flop circuit 310A-1, . . . , n, and when each circuit does not need to be distinguished in particular, it is referred to as the flip-flop circuit 310A.

An input terminal of the address decoder 300A is connected to the output terminal of the read pointer writing circuit 140A. An output terminal of the address decoders 300A is connected to each of the plurality of flip-flop circuit 310A and the control terminal of the input multiplexers 320A arranged for each address. The flip-flop circuit 310A configures the FIFO as described above. An input terminal of the input multiplexer 320A is connected to the read pointer calculator 190A. An output terminal of the multiplexers 320A is connected to the start position of the flip-flop circuit 310A. A control terminal of the input-multiplexer 320A is connected to the address decoder 300A. An input terminal of the output multiplexers 330A is connected to each of the plurality of flip-flop circuit 310A. An output terminal of the output multiplexer 330A is connected to the history buffer reading circuit 160A. A control terminal of the output multiplexer 330A is connected to the read pointer reading circuit 150A.

The address decoder 300A enables the input multiplexer 320A corresponding to an address specified by the read pointer writing circuit 140A, and writes a read pointer to the flip-flop circuit 310A arranged at the address. In other words, the read pointer table 120A has a plurality of read pointers for each address. The read pointer stored in the first flip-flop circuit 310A-1 moves to the second flip-flop circuit 310A-2 adjacent to the first flip-flop circuit 310A-1 before the read pointer is written to the start position of the first flip-flop circuit 310A-1. In this case where the read pointer is stored in the n-th flip-flop circuit 310A-n, the read pointer is deleted.

In other words, when a plurality of read pointer are written to a specified address in the read pointer table 120A, a written read pointer has already stored in the address, and at least a part of the stored read pointer must be overwritten, the read pointer writing circuit 140A overwrites the stored read pointer in the order from the oldest read pointer at the time of written.

The output multiplexor 330A selects an address corresponding to a hash value received from the read pointer reading circuit 150A, and a plurality of read pointers from the first flip-flop circuit 310A-1 to the n-the flip-flop circuit 310A-n corresponding to the selected address are read.

The history buffer reading circuit 160A reads a plurality of matching candidate data strings for one substring based on the plurality of read pointers read by the read pointer reading circuit 150A. The plurality of matching candidate data strings are input into the multi-stage comparator 184A and compared with the input data string.

Figure 8:
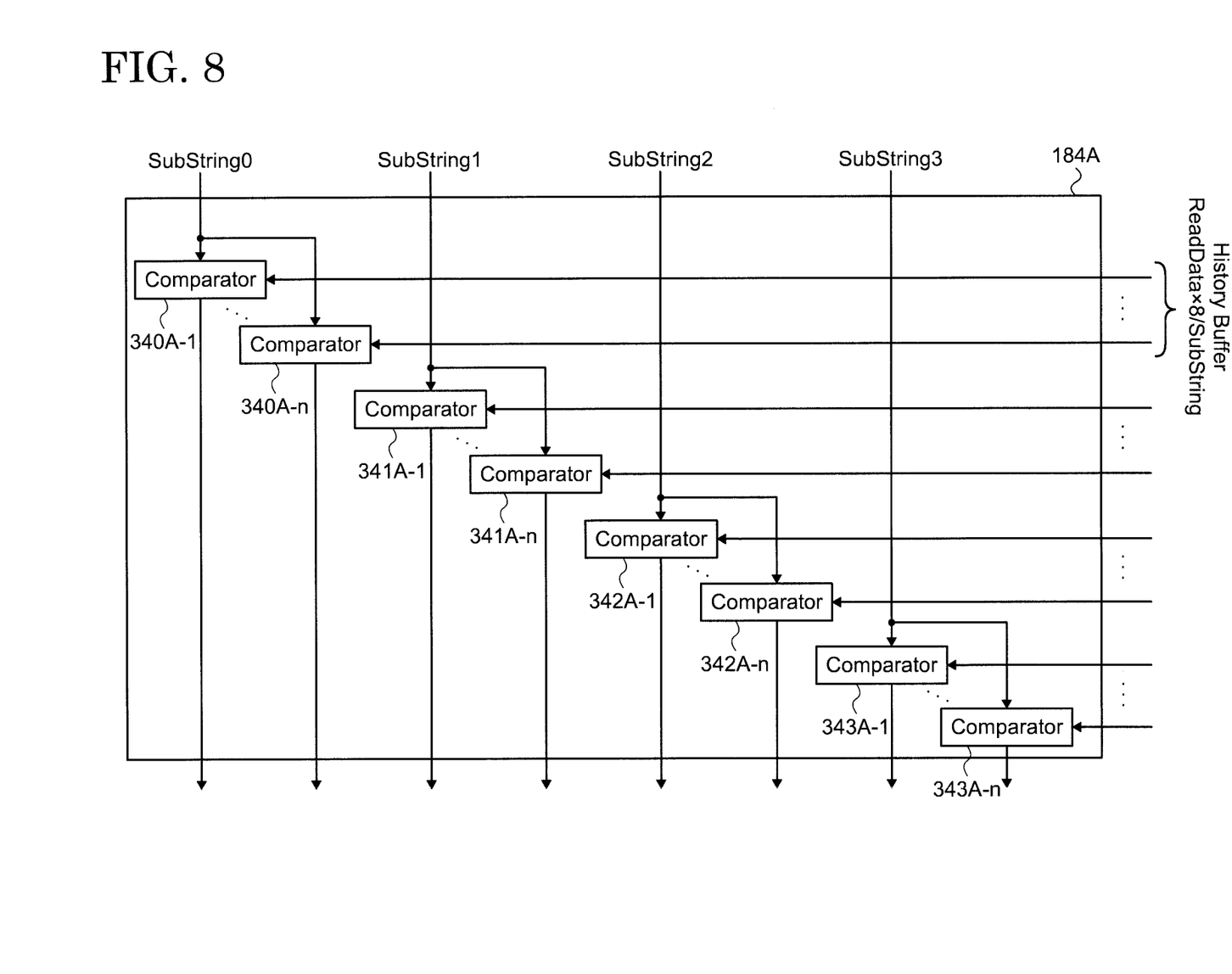
FIG. 8 is a block diagram illustrating a configuration of multi-stage comparator according to an embodiment.

FIG. 8 is a block diagram illustrating the configuration of the multi-stage comparator according to an embodiment. As shown in FIG. 8, a plurality of comparators 340A to 343A are arranged for each of the substrings 0 to 3. For example, a plurality of comparators are connected in parallel to the substring 0. The comparators are referred to as the comparators 340A-1, ..., n when they are described separately, and the comparators are referred to as comparators 340A when there is no need to distinguish them from each other. The number of comparators 340A arranged for each substring is equal to the number of the flip-flop circuits 310A arranged for each address.

In the present embodiment, the comparator 340A-1 is arranged for the flip-flop circuit 310A-1. The comparator 340A-n is arranged for the flip-flop circuit 310A-n. In this embodiment, a configuration in which n=8 is exemplified. That is, 8 matching candidate data strings read from the history buffer 100 based on the 8 read pointers for one substring, and each matching candidate data string is input to the comparator 340A. The comparator 340A-1 compares the matching candidate data string with the input the data string read based on the read pointer stored in the flip-flop circuit 310A-1. However, the number of the comparator does not necessarily have to coincide with the number of the flip-flop circuit 310A.

In the multi-stage comparator 184A, the result with the longest matching length is transmitted to the matching selector 170A among the comparators arranged for the same substring. For example, the result of the longest matching length among the matching length generated by each of the comparator 340A-1 to 340A-n arranged for substring 0 is transmitted to the matching selector 170A and the final matching result is generated by the matching selector 170A. The operation of the matching selector 170A is similar to the operation of the matching selector 170 shown in FIG. 2. The multi-stage comparator 184A and the matching selector 170A (matching circuit) process a plurality of matching candidate data strings read for one substring.

As described above, according to the memory system of the second embodiment, since the input data string and the plurality of matching candidate data strings can be compared, the input data string can be compressed using the matching candidate data string having a longer matching length. As a result, the compression performance can be further improved.

Third Embodiment

Figure 9:
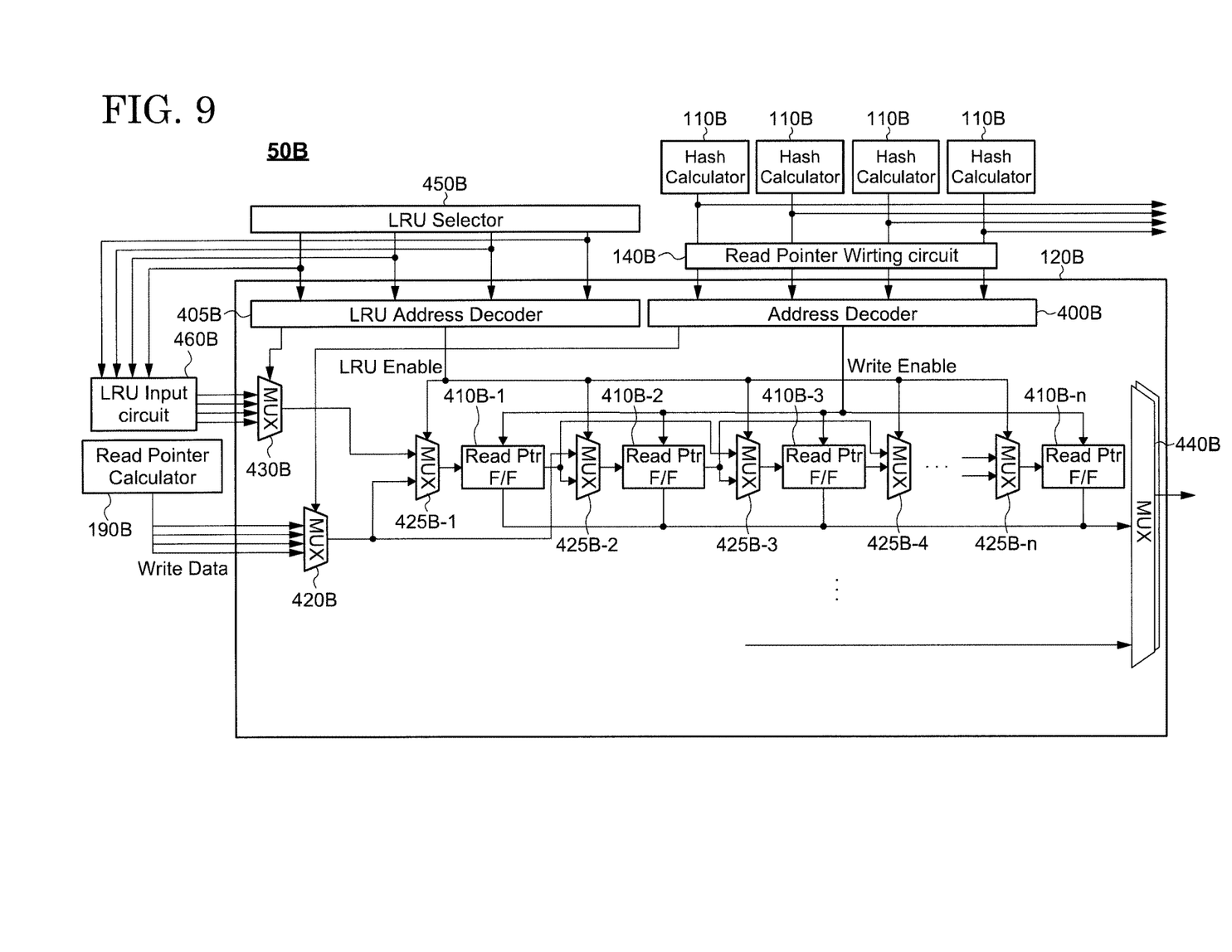
FIG. 9 is a block diagram illustrating a configuration of a pointer table according to an embodiment.

In the third embodiment, a compression circuit 50B having a configuration similar to that of the compression circuit 50A in the second embodiment is described. FIG. 9 is a block diagram illustrating a configuration of a pointer table according to an embodiment. In FIG. 9, a configuration of a part of the compression circuit 50B is illustrated. The compression circuit 50B shown in FIG. 9 is similar to the compression circuit 50A shown in FIG. 7, but a configuration of a read pointer table 120B differs from the configuration of the read pointer table 120A. The compression circuit 50B includes an LRU selection circuit 450B and an LRU input circuit 460B. In the following description, descriptions of the same features as those of the configuration of FIG. 7 are omitted, and points mainly different from those of the configuration of FIG. 7 are described.

In the compression circuit 50B according to the third embodiment, when the read pointer writing circuit 140B writes a plurality of read pointers to a specified address of the read pointer table 120B, a written read pointer has already stored in the address, and at least a part of the existing stored read pointer must be overwritten, the compression circuit 50B determines a read pointer to be overwritten among the read pointers already stored based on a referred history by the matching circuit (the multi-stage comparison circuit 184 and the match selection circuit 170). In the present embodiment, the LRU (Least Recently Used) is used as the history, but the present invention is not limited to the LRU.

As shown in FIG. 9, the read pointer table 120B includes an address decoder 400B, an LRU address decoder 405B, a plurality of flip-flop circuits 410B, an input multiplexer 420B, an LRU multiplexer 430B, a plurality of FF multiplexers 425B, and an output multiplexer 440B. The FF multiplexers 425B and the flip-flop circuit 410B are alternately and serially connected with each other with respect to the input multiplexers 420B and the LRU multiplexers 430B. The FF multiplexers 425B and the flip-flop circuit 410B are arranged in the same address. Each flip-flop circuit 410B stores a read pointer.

An input terminal of the address decoder 400B is connected to the output terminal of the read pointer writing circuit 140B. An output terminal of the address decoder 400B is connected to each of the plurality of flip-flop circuits 410B and a control terminal of the input multiplexer 420B. An input terminal of the address decoder 405B is connected to an output terminal of the LRU select circuitry 450B. An output terminal of the address decoder 405B is connected to a control terminal of each of the plurality of the FF multiplexers 425B and a control terminal of the LRU multiplexer 430B. An input terminal of the LRU multiplexer 430B is connected to an output terminal of the LRU input circuitry 460B.

The LRU select circuit 450B selects a target address when the read pointer stored in the flip-flop circuit 410B is written back to the flip-flop circuit 410B again. Specifically, the LRU select circuit 450B selects an address in the read pointer table 120B in which a read pointer was stored. The longest matching length is obtained to the stored read pointer in multi-stage comparator 184B (not shown). More specifically, the LRU select circuit 450B selects the read pointer stored in the flip-flop circuit 410B corresponding to the comparator having the longest matching length among the plurality of comparators (comparators corresponding to the comparators 340A to 343A in FIG. 8) arranged for the same substring in the multi-stage comparator 184B. The LRU select circuit 450B outputs a read pointer having the longest matching length as described above to the LRU input circuit 460B. For example, the read pointer to be written back may be a read pointer referred by the matching circuit one or more cycles ago.

An output terminal of the LRU multiplexer 430B is connected to an input terminal of the FF multiplexer 425B-1.

An output terminal of the input multiplexer 420B is connected to the input terminal of each of the FF multiplexers 425B-1, 425B-2. An output terminal of the FF multiplexer 425B-1 is connected to an input terminal of flip-flop circuit 410B-1. An output terminal of the flip-flop circuit 410B-1 is connected to the input terminal of each of the FF multiplexers 425B-2, 425B-3 and an input terminal of the output multiplexer 440B.

An output terminal of the FF multiplexer 425B-2 is connected to an input terminal of the flip-flop circuit 410B-2. An output terminal of the flip-flop circuit 410B-2 is connected to an input terminal of each of the FF multiplexers 425B-3 and 425B-4 and is connected to the input terminal of the output multiplexer 440B. An output terminal of the FF multiplexer 425B-3 is connected to an input terminal of the flip-flop circuit 410B-3. As described above, the flip-flop circuit 410B of each stage is connected to the two FF multiplexers 425B existing following one stage and following two stages than the present stage. In other words, the destination of the read pointer stored in the flip-flop circuit 410B is determined to the flip-flop circuit 410B existing following one stage and following two stages than the present stage by the control of the FF multiplexer 425B.

When a read pointer is written back, a read pointer to be written back is written to the flip-flop circuit 410 B-1, and a read pointer based on the input data string is written to the flip-flop circuit 410 B-2. In this case, the read pointer stored in the flip-flop circuit 410B-1 moves to the flip-flop circuit 410B-3 through the FF-multiplexer 425B-3. The read pointer stored in the flip-flop circuit 410B-2 moves to the flip-flop circuit (not shown) connected to the output terminal of the FF multiplexer 425B-4.

On the other hand, when a read pointer is not written back, the FF-multiplexers 425B and the flip-flop circuits 410B operate as the FIFO in the same way as in FIG. 7. That is, the read pointer based on the input data string is written to the flip-flop circuit 410B-1, and the read pointer stored in the flip-flop circuit 410B-1 moves to the flip-flop circuit 410B-2 via the FF-multiplexer 425B-2. The read pointer stored in the flip-flop circuit 410B-2 moves to the flip-flop circuit 410B-3 through the FF-multiplexer 425B-3.

As described above, the memory system according to the third embodiment, it is possible to leave a highly useful read pointer in the flip-flop circuit 410B, so that the compressive performance can be improved.

While several embodiments of the present invention have been described, these embodiments are presented as examples and are not intended to limit the scope of the present invention. For example, a person with skilled in the art can add, delete, or change design components as appropriate based on compression circuit of the present embodiment are also included in the scope of the present invention as long as they have the gist of the present invention. Furthermore, these embodiments described above can be appropriately combined as long as there is no mutual inconsistency, and technical matters common to the embodiments are included in the embodiments even if they are not explicitly described.

Even if it is other working effects which differ from the working effect brought about by the mode of each above-mentioned embodiment, what is clear from the description in this specification, or can be easily predicted by the person skilled in the art is naturally understood to be brought about by the present invention.

What is claimed is:

1. A memory system comprising:
a storage device and a memory controller configured to control the storage device and compress an input data string,
the memory controller including:
a history buffer configured to store a stored input data string;
a hash calculator configured to calculate a hash value based on the input data string;
a read pointer table configured to store a read pointer indicating an address in the history buffer in an address designated by the hash value;
a history buffer writing circuit configured to write the input data string to the history buffer;
a read pointer writing circuit configured to:
receive the hash value from the hash calculator, and
write the read pointer of the input data string to an address designated by the hash value calculated based on the input data string in the read pointer table after the memory controller receives the input data string;
a read pointer reading circuit configured to execute reading of the read pointer from the read pointer table using the hash value;
an address delay circuit configured to:
receive the hash value from the hash calculator,
delay the hash value, and
transmit the hash value to the read pointer reading circuit such that the writing of the read pointer writing circuit based on the hash value is executed before the reading of the read pointer reading circuit based on the hash value;
a history buffer reading circuit configured to read the stored input data string as a matching candidate data string from the history buffer using the read pointer read by the read pointer reading circuit; and
a matching circuit configured to replace the input data string with a reference information referring the matching candidate data string in a case where at least a part of the input data string and a part of the matching candidate data string match;
wherein reading of the read pointer by the read pointer reading circuit and reading of the stored input data string by the history buffer reading circuit are executed after writing of the read pointer by the read pointer writing circuit and writing of the input data string by the history buffer writing circuit are finished.

2. The memory system according to claim 1, wherein the history buffer includes a flip-flop circuit.

3. The memory system according to claim 1, wherein the read pointer table includes a flip-flop circuit.

4. The memory system according to claim 1, wherein the history buffer includes an SRAM.

5. The memory system according to claim 1, wherein the read pointer table includes an SRAM.

6. The memory system according to claim 1, wherein
the read pointer table includes a plurality of the read pointers in each address,
the read pointer reading circuit is configured to execute readings of the plurality of the read pointers,
the history buffer reading circuit is configured to read a plurality of the matching candidate data strings based on the plurality of the read pointers, and
the matching circuit is configured to operate the plurality of the matching candidate data strings.

7. The memory system according to claim 6, wherein the read pointer writing circuit is configured to overwrite in order from the read pointer whose timing of writing is older among the read pointers have already been written in a case where the plurality of the read pointers are written to an indicated address in the read pointer table, the read pointer already written exists in the indicated address and at least a part of the read pointer already written have to be overwritten.

8. The memory system according to claim 6, wherein the read pointer writing circuit is configured to determine the read pointer based on a reference history referred by the matching circuit in order to overwrite among the read pointers have already been written in a case where the plurality of the read pointers are written to an indicated address in the read pointer table, the read pointer already written exists in the indicated address and at least a part of the read pointer already written have to be overwritten.

9. The memory system according to claim 1, wherein
   the hash value is calculated by using data of byte length N from the top of the input data string, and
   the matching circuit is configured to replace the input data string with the reference information in the case where the input data string and the matching candidate data string match no less than N-bytes.

* * * * *